United States Patent
Seo et al.

(10) Patent No.: US 9,755,171 B2
(45) Date of Patent: Sep. 5, 2017

(54) ORGANIC LIGHT-EMITTING DIODE INCLUDING AN INTERLAYER TO MAINTAIN A HOLE-ELECTRON BALANCE IN THE EMITTING LAYER AND DISPLAY PANEL INCLUDING THE SAME

(71) Applicant: Samsung Display Co., Ltd., Yongin (KR)

(72) Inventors: Jihoon Seo, Suwon-si (KR); Sungjun Bae, Suwon-si (KR); Hyundo Jin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 14/803,551

(22) Filed: Jul. 20, 2015

(65) Prior Publication Data

US 2016/0149150 A1    May 26, 2016

(30) Foreign Application Priority Data

Nov. 26, 2014 (KR) .......................... 10-2014-0166644

(51) Int. Cl.
    *H01L 51/50* (2006.01)

(52) U.S. Cl.
    CPC ........ *H01L 51/5004* (2013.01); *H01L 51/508* (2013.01); *H01L 51/5068* (2013.01); *H01L 51/5072* (2013.01); *H01L 51/5084* (2013.01); *H01L 51/5096* (2013.01); *H01L 51/5012* (2013.01); *H01L 51/5092* (2013.01)

(58) Field of Classification Search
    CPC ............. H01L 51/5004; H01L 51/5056; H01L 51/5068; H01L 51/508; H01L 51/5084; H01L 51/5092; H01L 51/5096
    See application file for complete search history.

(56) References Cited

U.S. PATENT DOCUMENTS

| 8,735,873 B2 | 5/2014 | Song et al. |
| 2004/0245542 A1 | 12/2004 | Kim |
| 2006/0125382 A1 | 6/2006 | Kim et al. |

FOREIGN PATENT DOCUMENTS

| JP | 2004-079413 | 3/2004 |
| KR | 10-2003-0039100 | 5/2003 |
| KR | 10-2004-0044260 | 5/2004 |
| KR | 10-2006-0080044 | 7/2006 |
| KR | 10-2010-0073785 | 7/2010 |
| KR | 10-2013-0007873 | 1/2013 |
| KR | 10-2013-0029956 | 1/2013 |
| KR | 10-2013-0029956 | 3/2013 |

*Primary Examiner* — Anh Mai

(74) *Attorney, Agent, or Firm* — H.C. Park & Associates, PLC

(57) ABSTRACT

An organic light-emitting diode includes: a first electrode layer disposed on a base substrate; a second electrode layer disposed above the first electrode, and opposed to the first electrode; a emitting layer disposed between the first electrode layer and the second electrode layer, and including an inorganic material; a hole transport region disposed between the emitting layer and the first electrode layer; a first electron transport region disposed between the emitting layer and the second electrode layer; a interlayer disposed between the emitting layer and the first electron transport region, and having a lowest unoccupied molecular orbital (LUMO) energy level higher than that of the second electron transport region; and a second electron transport region disposed between the emitting layer and the interlayer, and contacting the emitting layer.

20 Claims, 7 Drawing Sheets

ORGANIC LIGHT-EMITTING DIODE INCLUDING AN INTERLAYER TO MAINTAIN A HOLE-ELECTRON BALANCE IN THE EMITTING LAYER AND DISPLAY PANEL INCLUDING THE SAME

CROSS-REFERENCE TO RELATED APPLICATION

This application claims priority from and the benefit of Korean Patent Application No. 10-2014-0166644, filed on Nov. 26, 2014, which is hereby incorporated by reference for all purposes as if fully set forth herein.

BACKGROUND

Field

Exemplary embodiments of the present invention relate to an organic light-emitting diode and a display panel including the same, and more particularly, to an organic light-emitting diode having high luminous efficiency and an improved lifespan, and a display panel including the same.

Discussion of the Background

An organic light-emitting diode has a high response speed, is driven at a low voltage, and is self-luminous. Accordingly, since an organic light-emitting display including such organic light-emitting diodes does not need a separate light source, the organic light-emitting display may have several advantages such as light weight, slimness, excellent brightness, and good viewing angles.

An organic light-emitting diode is a display device that has an emitting layer composed of an organic material between an anode and a cathode. Holes supplied from the anode and electrons supplied from the cathode combine in the emitting layer to form excitons, and then light corresponding to energy between the holes and the electrons is generated from the excitons.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting diode with improved luminous efficiency and lifespan, and a display panel including the same.

Additional aspects will be set forth in the detailed description which follows, and, in part, will be apparent from the disclosure, or may be learned by practice of the inventive concept.

An exemplary embodiment discloses an organic light-emitting diode that includes: a first electrode layer disposed on a base substrate; a second electrode layer disposed above the first electrode, and opposed to the first electrode layer; a emitting layer disposed between the first electrode layer and the second electrode layer; a hole transport region disposed between the emitting layer and the first electrode layer; a first electron transport region disposed between the emitting layer and the second electrode layer; a interlayer disposed between the emitting layer and the first electron transport region; and a second electron transport region disposed between the emitting layer and the interlayer, and contacting the emitting layer. A lowest unoccupied molecular orbital (LUMO) energy level of the interlayer is higher than that of the second electron transport region.

An exemplary embodiment also discloses a display panels including: a base substrate; and an organic light-emitting diode, wherein the organic light-emitting diode includes: a first electrode layer disposed on the base substrate; a second electrode layer disposed above the first electrode layer, and opposed to the first electrode layer; a emitting layer disposed between the first electrode layer and the second electrode layer; a hole transport region disposed between the emitting layer and the first electrode layer; a first electron transport region disposed between the emitting layer and the second electrode layer; a second electron transport region disposed between the emitting layer and the first electron transport layer, and contacting the emitting layer; and a interlayer disposed between the first electron transport region and the second electron transport region, and having a LUMO energy level higher than that of the second electron transport region.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
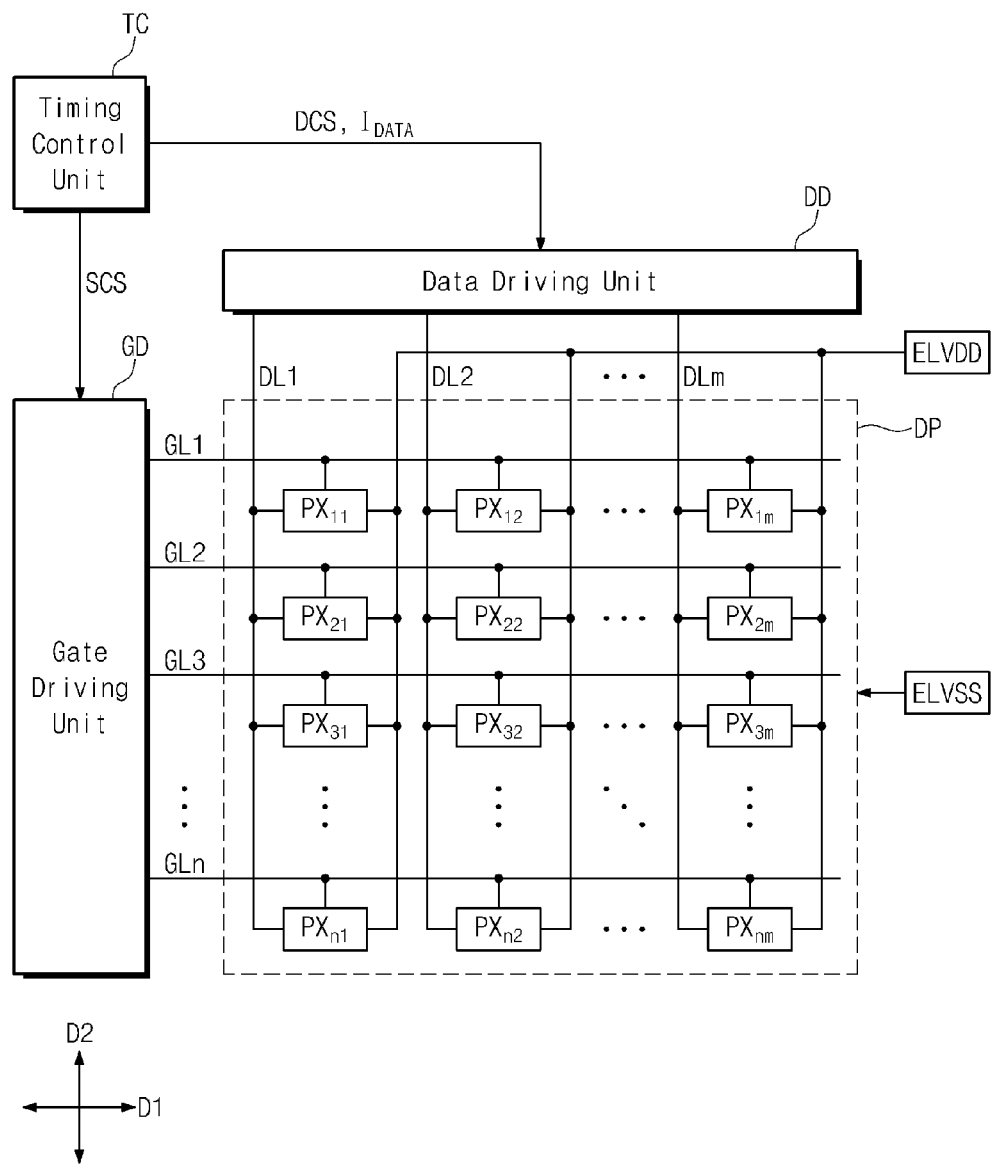
FIG. 1 is a block diagram illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
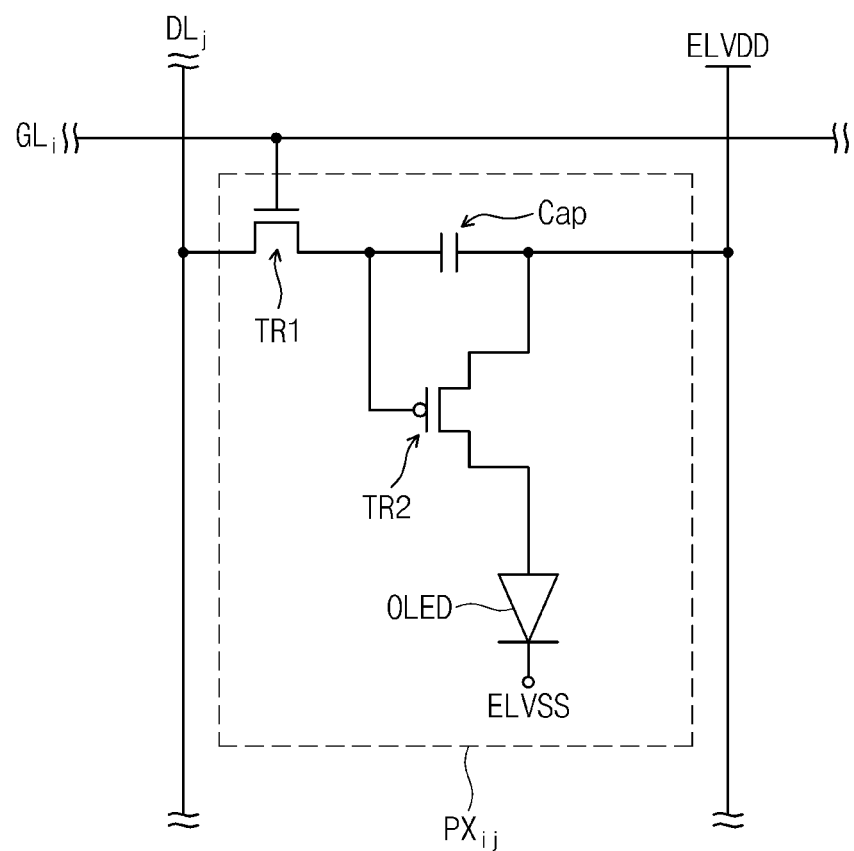
FIG. 2 is an equivalent circuit diagram of a pixel illustrated in FIG. 1.

FIG. 1 is a block diagram illustrating a display device according to an exemplary embodiment. FIG. 2 is an equivalent circuit diagram of a pixel illustrated in FIG. 1. A display device according to an exemplary embodiment of the inventive concept will be described with reference to FIGS. 1 and 2.

As illustrated in FIG. 1, a display device comprises a display panel DP, a timing controller TC, a gate driving unit GD, and a data driving unit DD.

The timing controller TC receives input image signals, and outputs image data $I_{DATA}$ converted so as to correspond to a driving mode of the display panel DP, and various control signals SCS and DCS The gate driving unit GD receives a gate driving control signal SCS from the timing controller TC. The gate driving unit GD, which is supplied with the gate driving control signal SCS, generates a plurality of gate signals. The gate signals are sequentially supplied to the display panel DP.

The data driving unit DD receives the data driving control signal DCS and the converted image data $I_{DATA}$ from the timing controller TC. The data driving unit DD generates a plurality of data signals on the basis of the data driving control signal DCS and the converted image data $I_{DATA}$. The data signals are supplied to the display panel DP.

The display panel receives an electric signal from an external source to display an image. The display panel DP comprises a plurality of gate lines GL1 to GLn, a plurality of data lines DL1 to DLm, and a plurality of pixels $PX_{11}$ to $PX_{nm}$.

The gate lines GL1 to GLm extend in a first direction D1, and are arranged in a second direction D2 intersecting with the first direction D1. The gate lines GL1 to GLn are sequentially supplied with gate signals from the gate driving unit GD.

The data lines DL1 to DLm intersect with the gate lines GL1 to GLn so as to be insulated therefrom. The data lines DL1 to DLm extend in the second direction D2, and are arranged in the first direction D1. The data lines DL1 to DLm receive data signals from the data driving unit DD.

The display panel DP is supplied with first power voltage ELVDD and second power voltage ELVSS from an external source. Each of the pixels $PX_{11}$ to $PX_{nm}$ responds to a corresponding gate signal to be turned on. Each of the pixels $PX_{11}$ to $PX_{nm}$ receives the first power voltage ELVDD and the second power voltage ELVSS, and responds to a corresponding data signal to generate light. The first power voltage ELVDD is higher than the second power voltage ELVSS.

The pixels $PX_{11}$ to $PX_{nm}$ may be arranged in a matrix configuration. Each of the pixels $PX_{11}$ to $PX_{nm}$ is connected to a corresponding gate line of the gate lines GL1 to GLn, and is connected to a corresponding data line of the data lines DL1 to DLm.

Each of the pixels $PX_{11}$ to $PX_{nm}$ receives a gate signal from the corresponding gate line, and receives a data signal from the corresponding data line. Each of the pixels $PX_{11}$ to $PX_{nm}$ responds to the corresponding gate signal to be turned on. Each of the pixels $PX_{11}$ to $PX_{nm}$ generates light corresponding to a corresponding data signal to display an image.

Each of pixels $PX_{11}$ to $PX_{nm}$ includes at least one transistor, at least one capacitor, and an organic light-emitting diode. FIG. 2 exemplarily illustrates an equivalent circuit of a pixel $PX_{ij}$ that is connected to an i-th gate line GLi of the plurality of gate lines GL1 to GLn and a j-th data line DLj of the plurality of data lines DL1 to DLm.

The pixel $PX_{ij}$ includes a first transistor TR1, a second transistor TR2, a capacitor Cap, and an organic light-emitting diode (OLED) as a display element. The first transistor TR1 includes a control electrode connected to a gate line GLi, an input electrode connected to a data line DLj, and an output electrode. The first transistor TR1 responds to a gate signal flowing in the gate line GLi to output a data signal flowing in the data line DLj.

The capacitor Cap includes a first capacitor electrode connected to the first transistor TR1 and a second capacitor electrode receiving the first power voltage ELVDD. The capacitor Cap stores an electric charge corresponding to a difference between voltages corresponding to the data signal received from the first transistor TR1 and the first power voltage ELVDD.

The second transistor TR2 includes a control electrode connected to the output electrode of the first transistor TR1 and the first capacitor electrode of the capacitor Cap, an input electrode receiving the first power voltage ELVDD, and an output electrode. The output electrode of the second transistor TR2 is connected to the organic light-emitting diode (OLED).

The second transistor TR2 responds to the electric charge stored in the capacitor Cap to control a driving current flowing in the organic light-emitting diode (OLED). A turn-on time of the second transistor TR2 is determined according to the electric charge stored in the capacitor Cap. The output electrode of the second transistor TR2 supplies a voltage lower than the second power voltage ELVDD to the organic light-emitting diode (OLED).

The organic light-emitting diode (OLED) is connected to the second transistor TR2, and receives the second power voltage ELVSS. The organic light-emitting diode (OLED) emits light during a turn-on period of the second transistor TR2.

The organic light-emitting device (OLED) includes a luminous material. The organic light-emitting device (OLED) may generate light having a color corresponding to the luminous material. The color of the light generated in the organic light-emitting device (OLED) may be any one of red, green, blue, and white. Details with respect to the organic light-emitting device (OLED) will be described later.

Figure 3:
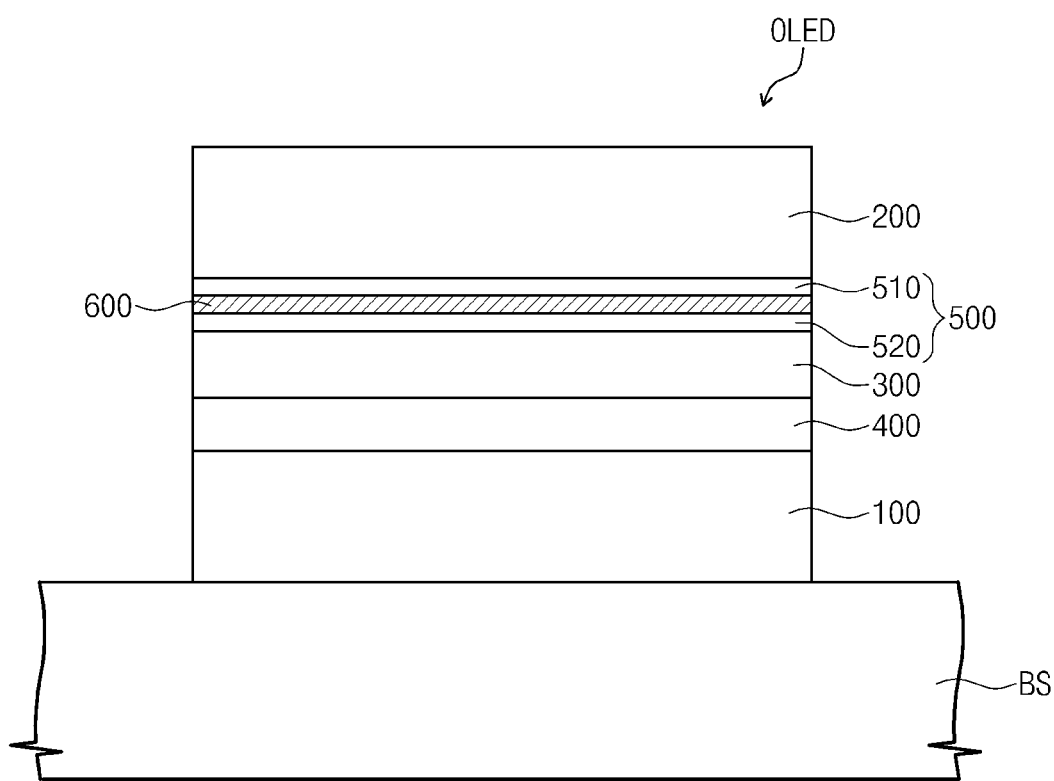
FIG. 3 is a cross-sectional view illustrating an organic light-emitting diode according to an exemplary embodiment.

FIG. 3 is a cross-sectional view illustrating an organic light-emitting diode (OLED) according to an exemplary embodiment. As illustrated in FIG. 3, an organic light-emitting diode (OLED) includes a first electrode layer 100, a second electrode layer 200, a emitting layer 300, a hole transport region 400 (or a hole control layer), an electron transport region 500 (or an electron control layer), and an interlayer 600.

In the present exemplary embodiment, the organic light-emitting device (OLED) is disposed on a base substrate BS. The base substrate BS may include a plurality of thin films (not shown). The thin films may include an inorganic thin film and/or an organic thin film.

The thin films include the first transistor TR1, the second transistor TR2, and the capacitor Cap, which are illustrated in FIG. 2, and may further include insulation films disposed between the first transistor TR1, the second transistor TR2, and the capacitor Cap.

The first electrode layer 100 is disposed on the base substrate BS. Although not illustrated, the first electrode layer 100 is electrically connected to the second transistor TR2. In the case where the first electrode layer 100 is disposed on the second transistor TR2, the first electrode 100 may be connected to the second transistor TR2 through a through-hole (not illustrated) or the like.

The first electrode layer 100 may be a pixel electrode or an anode. The first electrode layer 100 may be formed of a material having a high work function such that holes are easily injected.

The first electrode layer 100 includes a conductive material. The first electrode layer 100 may be a reflective electrode, a semi-transparent electrode, or a transparent electrode. For example, the first electrode layer 100 may include a transparent conductive oxide (TCO), for example, at least one of indium tin oxide (ITO), indium zinc oxide (IZO), tin oxide ($SnO_2$), and zinc oxide (ZnO). Otherwise, the first electrode layer 100 may include at least one of magnesium (Mg), aluminum (Al), silver (Ag), platinum (Pt), palladium (Pd), gold (Au), nickel (Ni), neodymium (Nd), iridium (Ir), chromium (Cr), and an alloy thereof, all of which have high reflectivity.

The first electrode layer 100 may be a single layer or a multi-layer. For example, the first electrode layer 100 may have a single-layered structure formed of indium tin oxide (ITO), silver, or a metal alloy, a two-layered structure formed of ITO/Mg or ITO/MgF, or a three-layered structure formed of ITO/Ag/ITO. However, the first electrode layer is not limited to any one embodiment.

The second electrode layer 200 is disposed above the first electrode layer 100. The second electrode layer 200 may be a common electrode or cathode.

The second electrode layer 200 is opposed to the first electrode layer 100. For example, when the first electrode layer 100 is an anode, the second electrode layer 200 may be may be a cathode. Accordingly, the second electrode layer 200 may be formed of a material having a low work function such that electrons are easily injected.

The second electrode layer 200 includes a conductive material. The conductive material may be a metal, an alloy, a conductive compound, and a mixture thereof. For example, the second electrode layer 200 may include at least one of reflective materials consisting of lithium (Li), magnesium (Mg), aluminum (Al), aluminum-lithium (Al—Li), calcium (Ca), magnesium-indium (Mg—In), and magnesium-silver (Mg—Ag). Otherwise, the second electrode layer 200 may include transparent materials consisting of indium tin oxide, indium zinc oxide, zinc oxide, and indium tin oxide.

The second electrode layer 200 may have a single layer or a multi-layer structure. The multi-layer structure may include at least one of a layer formed of a reflective material, and a layer formed of a transparent material.

The second electrode layer 200 may be a reflective electrode, a semi-transparent electrode, or a transparent electrode. The second electrode layer 200 is not limited to any one embodiment, but may be formed of various materials according to a structure of the organic light-emitting diode (OLED).

The emitting layer 300 is disposed between the first electrode layer 100 and the second electrode layer 200. The emitting layer 300 may have a single-layered structure formed of a single material, a single-layered structure formed of a plurality of different materials, or a multi-layered structure composed of a plurality of layers that are formed of a plurality of different materials.

The emitting layer 300 includes an organic material. The organic material is not particularly limited to a material, so long as the material is typically used. For example, the emitting layer 300 may be formed of at least one of materials that emit red, green, and blue, and include a fluorescent material or a phosphorescent material.

Also, the organic material includes a host material and a dopant material. Each of the host material and the dopant material may include a known host material or a known dopant material. For example, the host material may be tris(8-quinolinolato)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN), but is not limited thereto.

The dopant material may include a blue dopant material, a green dopant material, and/or a red dopant material. For example, when the emitting layer 300 emits red light, the emitting layer 300 may include a fluorescent material that includes, for example, PBD:Eu(dbm)3(Phen), tris(dibenzoylmethane)phenanthroline europium or perylene.

The red dopant material may be selected from metal complexes, such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), or an organometallic complex, but is not limited thereto.

When the emitting layer 300 emits green light, the emitting layer 300 may include a fluorescent material that includes, for example, tris(8-hydroxyquinolino)aluminum (Alq3). At this time, a green dopant material may be selected from, for example, a metal complex such as fac-tris(2-phenylpyridine)iridium (Ir(ppy)3) or an organometallic complex, but is not limited thereto.

Meanwhile, when the emitting layer 300 emits blue light, the emitting layer 300 may include a fluorescent material that includes any one selected from the group consisting of, for example, spiro-DPVBi, spiro-6P, distyryl-benzene (DSB), distyryl-arylene (DSA), a polyfluorene (PFO)-based polymer, and a poly(p-phenylene vinylene) (PPV)-based polymer. At this time, a blue dopant material may be selected from, for example, a metal complex such as (4,6-F2ppy) 2Irpic or an organometallic complex, but is not limited thereto.

The emitting layer 300 may be formed by using various methods such as a vacuum deposition method, a spin coating method, a casting method, a Langmuir-Blodgett (LB) method, an inkjet printing method, a laser-printing method, or a laser induced thermal imaging (LITI) method.

The hole transport region 400 is defined between the emitting layer 300 and the first electrode layer 100. The hole transport region 400 is a region via which holes are injected from the first electrode layer 100 in order to reach the emitting layer 300.

The hole transport region 400 may include at least one of a hole injection layer, a hole transport layer, and a single layer that has a hole injection function and a hole transport function at the same time. The hole transport region 400 may be formed of at least one of a hole injection material and a hole transport material.

Each of the hole injection material and the hole transport material may be a known material. For example, when the hole transport region 400 includes a hole transport layer, the hole transport region 400 may include carbazole derivatives such as N-phenyl carbazole or polyvinyl carbazole, a fluorine-based derivative, triphenylamine-based derivatives such as N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine (TAPC), but is not limited thereto.

When the hole transport region 400 includes a hole injection layer, the hole transport region 400 may include at least one of a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N-(2-naphthyl)-N-phenylamino}-triphenylamine (2TNATA), poly(3,4-ethylenedioxythiophene)/poly(4-styrenesulfonate) (PEDOT/PSS), a polyaniline/dodecylbenzenesulfonic acid (PANI/DBSA), a polyaniline/camphor sulfonic acid (PANI/CSA), and polyaniline/poly(4-styrenesulfonate) (PANI/PSS), but is not limited thereto.

The hole transport region 400 may have a thickness of about 100 Å to about 10,000 Å, for example, about 100 Å to about 1,000 Å. When the hole transport region 400 includes both the hole transport layer and the hole injection layer, the hole injection layer may have a thickness of about 100 Å to about 10,000 Å, for example, about 100 Å to about 1,000 Å. Also, the hole transport layer may have a thickness of about 50 Å to about 2,000 Å, for example, about 100 Å to about 1,500 Å. At this time, the organic light-emitting diode (OLED) may have a desirable hole transport characteristic without a substantial increase in driving voltage.

The hole transport region 400 may be formed through a similar process to the process for forming the emitting layer 300. For example, the hole transport region 400 may be formed by using various methods, such as a vacuum deposition method, a spin coating method, a casting method, a Langmuir-Blodgett (LB) method, an inkjet printing method, a laser printing method, or a laser induced thermal imaging (LITI) method.

Meanwhile, the hole transport region 400 may include a hole blocking layer. When the hole transport region 400 includes the hole blocking layer, the hole transport region 400 may include a known hole blocking material. The hole blocking layer may include at least one of 2,9-dimethyl-4,7-diphenyl-1,10-phenanthroline (BCP) and 4,7-diphenyl-1,10-phenanthroline (Bphen), but is not limited thereto. The hole blocking layer may have a thickness of about 20 Å to about 1,000 Å, for example, about 30 Å to about 300 Å. When the thickness of the hole blocking layer lies within the aforementioned range, an excellent hole blocking characteristic may be obtained without the need for a substantial increase in driving voltage.

In order to prevent diffusion of triplet excitons or holes toward the electron transport region 500 when a phosphorescent dopant material is used in the emitting layer 300, the hole blocking layer may be formed by using methods such as a vacuum deposition method, a spin coating method, a spin coating method, a casting method, or an LB method. When the hole blocking layer is formed through the vacuum deposition method and the spin coating method, the forming condition of the hole blocking layer may be varied according to an used composition, but generally, the hole blocking layer may be formed under nearly the same condition range as the forming of the hole injection layer.

The hole transport region 400 may further include a charge generating material. The charge generating material may be uniformly dispersed in the hole transport region 400 to form a single region, or may be non-uniformly dispersed to partition the hole transport region 400 into a plurality of regions.

For example, the charge generating material may be a p-type dopant material. The charge generating material may be one of a quinone derivative, a metal oxide, and a cyano group-containing compound, but is not limited thereto. For example, non-limiting examples of the p-type dopant material may be quinone derivatives such as tetracyanoquinodimethane (TCNQ) and 2,3,5,6-tetrafluoro-tetracyanoquinodimethane (F4-TCNQ), and metal oxide such as a tungsten oxide and a molybdenum oxide, but is not limited thereto.

The electron transport region 500 is defined between the emitting layer 300 and the second electrode layer 200. The electron transport region 500 is a region via which electrons injected from the second electrode layer 200 are in order to reach the emitting layer 300.

The electron transport region 500 may include at least one of an electron transport material and an electron injection material. For example, the electron transport material may include tris(8-hydroxyquinolinato)aluminum (Alq3), 1,3,5-Tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), and a mixture thereof, but is not limited thereto.

Also, for example, the electron injection material may be a lanthanide group metal such as LiF, lithium quinolate (LiQ), $Li_2O$, BaO, NaCl, CsF, or Yb, metal halide such as RbCl or RbI, or a material in which an electron transport material and an organo metal salt are mixed, but is not limited thereto.

The organo metal salt may be a material having an energy band gap of about 4 eV or more. In detail, for example, the organo metal salt may include metal acetate, metal benzoate, metal acetoacetate, metal acetylacetonate, or metal stearate.

The electron transport region 500 may be formed by using various methods such as a vacuum deposition method, a spin coating method, a casting method, an LB method, an inkjet printing method, a laser printing method, or a LITI method.

The electron transport region 500 may include a first electron transport region 510 and a second electron transport region 520. The first electron transport region 510 and the second electron transport region 520 are spaced apart from each other with the interlayer 600 in-between.

The first electron transport region 510 is disposed between the second electrode layer 200 and the interlayer 600. The first electron transport region 510 contacts each of the second electrode layer 200 and the interlayer 600.

The first electron transport region 510 may include at least one of an electron transport material and an electron injection material. The first electron transport region 510 may have a single-layered structure or a multi-layered structure.

FIG. 3 illustrates an exemplary embodiment in which each of the first electron transport region 510 and the second electron transport region 520 is composed of a single layer. For example, each of the first electron transport region 510 and the second electron transport region 520 may be an electron transport layer that includes an electron transport material, or an electron injection/transport single-layer that includes an electron transport material and an electron injection material.

The second electron transport region 520 is defined between the emitting layer 300 and the interlayer 600. In the present exemplary embodiment, the second electron transport region 520 may contact the emitting layer 300. The second electron transport region 520 may be formed of a material that has electron affinity lower than that of a material forming the emitting layer 300.

Although not illustrated, the second electron transport region 520 may be composed of a plurality of layers. At this time, among the second electron transport region 520, materials which form a layer contacting the emitting layer 300 may have electron affinity lower than a material which forms the interlayer 600.

In the present exemplary embodiment, the first electron transport region 510 may include a material forming the second electron transport region 520. Accordingly, the first electron transport region 510 and the second electron transport region 520 may have substantially the same energy band gap. Details with respect to this will be described later.

The interlayer 600 is disposed in the electron transport region 500. For example, the interlayer 600 may be inserted into the electron transport region 500. Therefore, the electron transport region 500 is partitioned into the first electron transport region 510 and the second electron transport region 520. The interlayer 600 may not contact the emitting layer 300.

The interlayer 600 controls the amount of electrons that are injected from the second electrode layer 200 to the emitting layer 300. For example, in the present exemplary embodiment, the interlayer 600 may be an electron blocking layer. The interlayer 600 may reduce the number of electrons that are transferred toward the emitting layer 300 to maintain a hole-electron balance in the emitting layer 300.

The interlayer 600 includes a material having high electron affinity. In detail, the interlayer 600 may be formed of a material that has electron affinity higher than that of a material forming the electron transport region 500 adjacent to the interlayer 600.

The interlayer 600 may include a known electron blocking material. The electron blocking material is, but is not particularly limited to, a material having a high LUMO energy level as will be described later. For example, the electron blocking material may include a triarylamine-based triphenylamine derivative, a carbazole derivative, a spirobifluorene derivative, and the like. In detail, the electron blocking material may include at least one of TCTA, spiro- TAD, and a metal complex, and the metal complex may be, for example, Irppz or ppz2Ir(dpm), but the present invention is not so limited.

Meanwhile, the interlayer 600 has a highest occupied molecular orbital (HOMO) energy level higher than that of the first electron transport region 510. When the first electron transport region 510 has a multi-layered structure, the HOMO energy level of the interlayer 600 is higher than that of a layer of the first electron transport region 510, which contacts the emitting layer 300. Details with respect to this will be described later.

The interlayer 600 may have a thickness of about 20 Å to about 1,000 Å, for example, about 30 Å to about 300 Å. When the thickness of the interlayer 600 lies within the aforementioned range, an excellent hole blocking characteristic may be obtained without a substantial increase in driving voltage.

Figure 4:
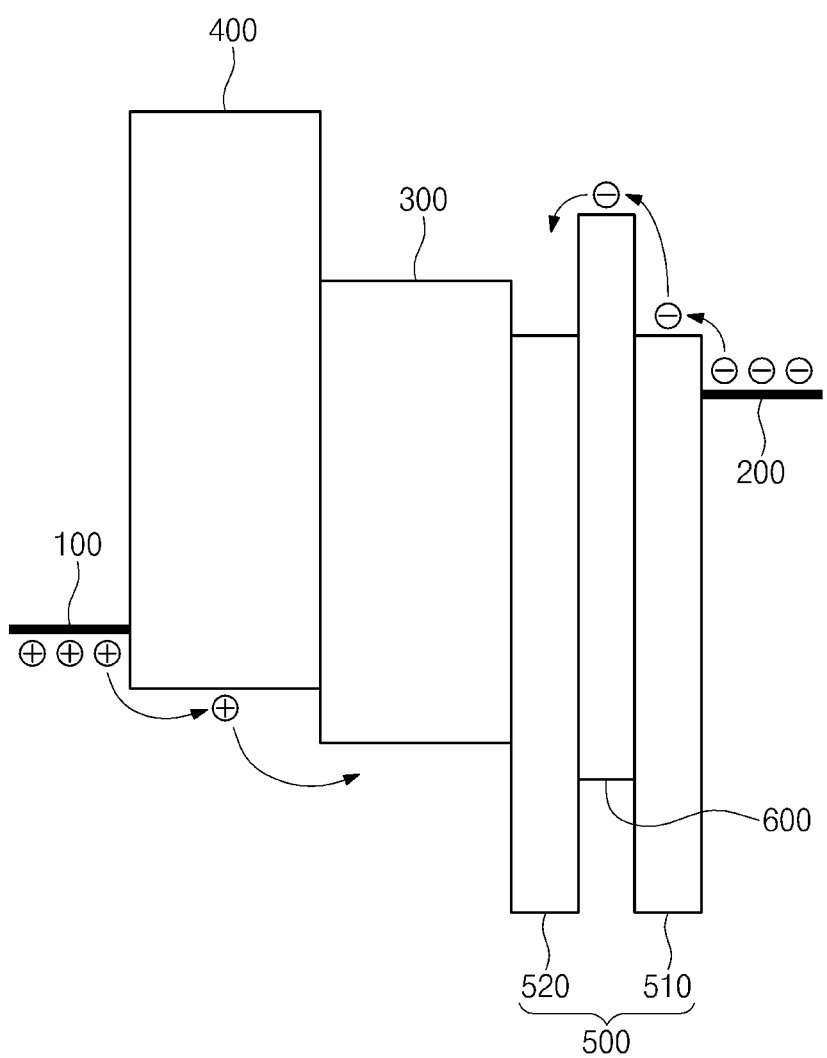
FIG. 4 is a band diagram of an organic light-emitting diode illustrated in FIG. 1.

FIG. 4 is a band diagram of the organic light-emitting diode illustrated in FIG. 1. FIG. 4 schematically illustrates an energy band of each of the layers illustrated in FIG. 3. As illustrated in FIG. 4, an organic light-emitting diode (OLED: see FIG. 3) is composed of layers that have different energy bands.

Generally, an intermolecular bonding force of an organic material is relatively very weak compared to an ionic bond or the like. Therefore, an electron energy level of any organic layer is quantized to be expressed as an energy band having a predetermined gap. An energy band of any organic layer may be defined as a gap between a lowest unoccupied molecular orbital (LUMO) energy level and a highest occupied molecular orbital (HOMO) energy level.

The LUMO energy level is the lowest energy level that is not filled with electrons, and may correspond to the energy level of the bottom of the conduction band in an inorganic semiconductor. The LUMO energy level corresponds to electron affinity of a relevant layer.

When a predetermined electric field is applied to a light-emitting diode, electrons existing in a cathode are transferred to an adjacent layer by the applied electric field. At this time, the higher the LUMO energy level gap is between adjacent layers, the higher the required energy field is.

The LUMO energy level is related to an electron transfer. Electrons may be transferred from a layer having a low LUMO energy level to a layer having a high LUMO energy level by the applied electric field. Generally, an electron transport region has a LUMO energy level between a work function of a cathode and a LUMO energy level of an emitting layer. Also, when the electron transport region is composed of a plurality of layers, LUMO energy levels of the plurality of layers are progressively increased as it travels from the cathode to the emitting layer.

The HOMO energy level is the highest energy level that is filled with electrons. The HOMO energy level may correspond to the energy level of the top of the valence band in an inorganic semiconductor. A HOMO energy level of any layer corresponds to an ionization potential. The ionization potential is the energy required for ionizing a material, and the higher the ionization potential, the more difficult the material is ionized.

When a predetermined electric field is applied to an organic light-emitting diode, holes existing in an anode are transferred to an adjacent layer by the applied electric field. At this time, the higher the HOMO energy level gap is between adjacent layers, the higher the required energy field is.

The HOMO energy level is related to a hole transfer. Holes may be transferred from a layer having a high HOMO energy level to a layer having a low HOMO energy level by the applied electric field. Generally, a hole transport region has a HOMO energy level between a work function of an anode and a HOMO energy level of a emitting layer. Also, when the hole transport region is composed of a plurality of layers, HOMO energy levels of the plurality of layers are progressively decreased as it travels from the anode to the emitting layer.

As illustrated in FIG. 4, the HOMO energy levels of respective layers are sequentially decreased as it travels from the first electrode layer 100 to the hole transport region 400 and the emitting layer 300. Therefore, holes injected from the first electrode layer 100 may be induced into the emitting layer 300 step by step via the hole transport region 400.

The LUMO energy levels of the respective layers are sequentially increased as it travels from the second electrode layer 200 to the electron transport region 500 and the emitting layer 300. Therefore, electrons injected from the second electrode layer 200 may be induced into the emitting layer 300 step by step via the electron transport region 500.

At this time, the interlayer 600 has a LUMO energy level higher than that of the electron transport region 500. The interlayer 600 has a LUMO energy level higher than that of each of two layers adjacent to the interlayer 600, for example, the first electron transport region 510 and the second electron transport region 520.

In the present embodiment, a region which contacts the emitting layer 300 has a LUMO energy level lower than that of the interlayer 600. At this time, the LUMO energy level of the interlayer 600 may be higher than that of the emitting layer 300.

Therefore, since the interlayer 600 has the higher LUMO energy level, the interlayer 600 controls the amount of electrons that are transferred from the first electron transport region 510 to the second electron transport region 520. A transfer of electrons from the second electron transport region 520 to the emitting layer 300 is easier than that of electrons from the first electron transport region 510 to the second electron transport region 520.

Therefore, electrons that are restricted in the amount and transfer velocity by the interlayer 600, may participate in electron-hole recombination while being transferred to the emitting layer 300.

Although not illustrated, the first electron transport region 510 and the second electron transport region 520 may be integrally connected to each other. The first electron transport region 510 and the second electron transport region 520 may have one energy band. At this time, the interlayer 600 is inserted into the electron transport region 500, and thus, an energy band of the interlayer 600 and an energy band of the electron transport region 500 may overlap each other. The organic light-emitting diode according to an exemplary embodiment of the inventive concept is not limited to any one embodiment.

Electrons injected from the second electrode layer 200 are restrictively transferred by a LUMO energy level that is sharply increased in the interlayer 600 while passing through the electron transport region 500. Therefore, the interlayer 600 may control the amount of electrons that are injected from the second electrode layer 200 to the emitting layer 300.

In a general organic light-emitting diode, an energy barrier between a hole transport region and a emitting layer is greater than that between an electron transport region and the emitting layer. Therefore, electrons which are injected into the emitting layer are relatively more than holes which are injected into the emitting layer.

Among electrons injected into the light-emitting, electrons, which do not participate in light-emitting, can accumulate inside the emitting layer. Energy emitted by excitons generated by combination of electrons and holes is not used in light-emitting. As such, Auger recombination, in which the unused energy is transferred to electrons accumulated inside the emitting layer, is likely to occur. Therefore, the luminous efficiency of an organic light-emitting diode may be reduced.

The interlayer 600 according to exemplary embodiments restricts the amount of electrons that are injected into the emitting layer 300 to induce electrons and holes to be balanced in the emitting layer 300. Therefore, the luminous efficiency of the organic light-emitting diode according to an embodiment of the inventive concept may be improved.

Meanwhile, a gap between a HOMO energy level of the interlayer 600 and a HOMO energy level of the emitting layer 300 is smaller than that between a HOMO energy level of the second electron transport region 520 and the HOMO energy level of the emitting layer 300. For example, the HOMO energy level of the interlayer 600 is higher than that of the second electron transport region 520.

Accordingly, when the interlayer 600 is formed so as to contact the emitting layer 300, holes existing in the emitting layer 300 are likely to flow out of the emitting layer 300 through the interlayer 600. When holes flow out of the emitting layer 300, electrons and holes may be unbalanced in the emitting layer 300.

Also, while holes are transferred through the interlayer 600, the number of holes that are annihilated without emission of light from the emitting layer 300 may be increased. As holes flow out of the emitting layer 300, luminescence may be generated not in an inside of the emitting layer 300, but on an interface between the electron transport region 500 and the emitting layer 300. Therefore, the interface between the electron transport region 500 and the emitting layer 300, in detail, an interface between the second electron transport region 520 and the emitting layer 300, is easily deteriorated.

The interlayer 600 according to this exemplary embodiment does not contact the emitting layer 300. Since the interlayer 600 is spaced apart from the emitting layer 300, holes present in the emitting layer 300 may be prevented from flowing out of the emitting layer 300 through the interlayer 600.

Therefore, a time in which holes in the emitting layer 300 stay inside the emitting layer 300 may be increased. Holes in the emitting layer 300 may be balanced with electrons that are restricted in injection by the interlayer 600, and a recombination region is moved from an interface of the emitting layer 300 and the electron transport region 500 to an inside of the emitting layer 300. Therefore, the lifespan of an organic light-emitting diode may be improved.

In the organic light-emitting diode according to exemplary embodiments, the interlayer 600, which controls an electron transfer, is spaced apart from an interface of the emitting layer 300. According to exemplary embodiments, the luminous efficiency and the lifespan of the organic light-emitting diode may be increased only through an adjustment of a layer structure even when a material is not changed, or a new layer is not further included.

Figure 5:
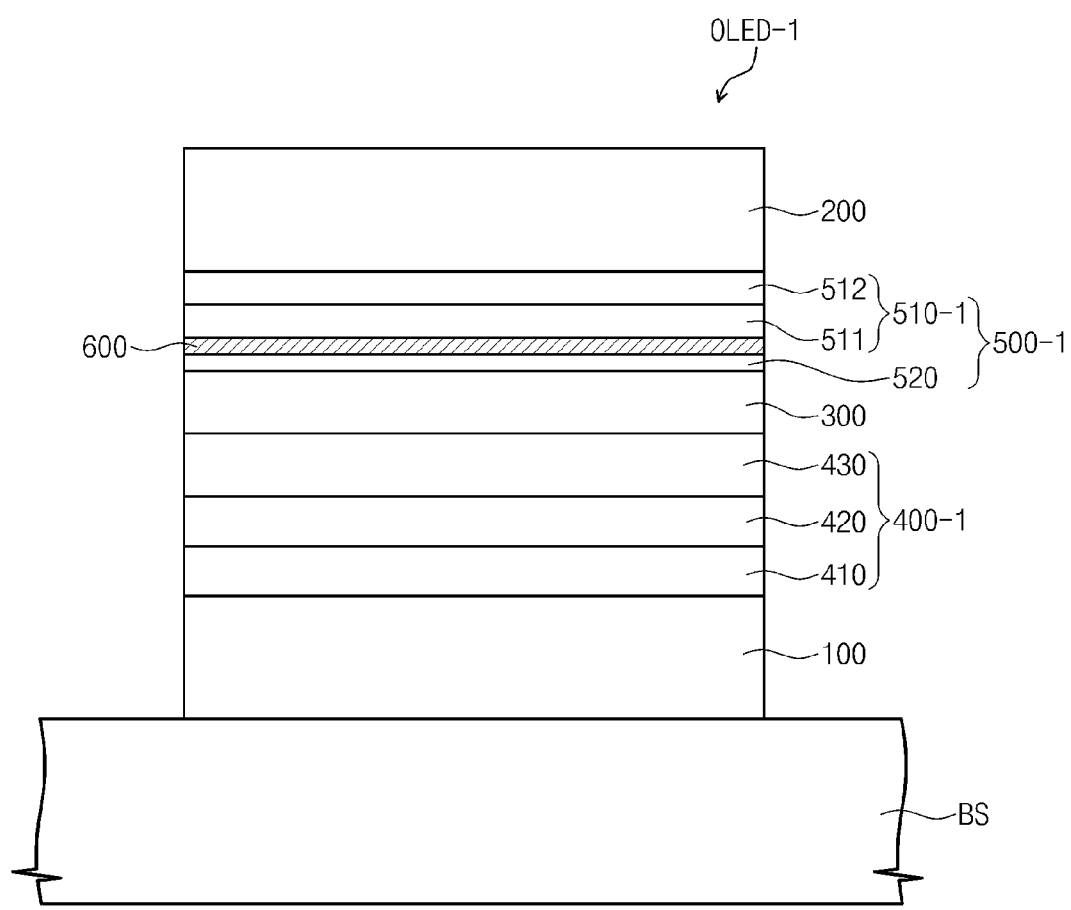
FIG. 5 is a cross-sectional view illustrating an organic light-emitting diode according to an exemplary embodiment.

FIG. 5 is a cross-sectional view illustrating an organic light-emitting diode according to an embodiment of the inventive concept. An organic emitting layer (OLED-1) illustrated in FIG. 5 has the same configuration as the organic light-emitting diode (OLED) illustrated in FIG. 3 except for a hole transport region 400-1 and an electron transport region 500-1. Hereinafter, the same elements as configurations illustrated in FIGS. 1 to 4 will be represented with the same reference numerals, and a detailed description thereof will be omitted.

As illustrated in FIG. 5, the hole transport region 400-1 may be composed of a plurality of layers. The hole transport region 400-1 may include a hole injection layer 410, a hole transport layer 420, and an auxiliary layer 430.

The hole injection layer 410 induces holes supplied from a first electrode layer 100 to be easily injected. The hole transport layer 420 is disposed on the hole injection layer 410. The hole injection layer 410 includes a hole injection material, and the hole transport layer 420 includes a hole transport material. Details with respect to this are replaced with details illustrated in FIG. 3.

The auxiliary layer 430 is disposed on the hole transport layer 420. The auxiliary layer 430 contacts an emitting layer 300. The auxiliary layer 430 may be, for example, an interlayer. At this time, the auxiliary layer 430 may include a material that may be included in the hole injection layer 410 and the hole transport layer 420.

Otherwise, for example, the auxiliary layer 430 may be an electron blocking layer. The auxiliary layer 430 prevent electrons from flowing from the emitting layer 300 to the hole transport region 400-1.

The electron transport region 500-1 may include a first electron transport region 510-1 composed of a plurality of layers. The first electron transport region 510-1 comprises a first layer 511 and a second layer 512 which are sequentially stacked.

In the present exemplary embodiment, the first layer 511 may be an electron transport layer including an electron transport material. The second layer 512 may be an electron injection layer including an electron injection material. That is, the first electron transport region 510-1 may be an embodiment that further includes the second layer 512 compared with the first electron transport region 510 illustrated in FIG. 5.

Energy band gaps of layers adjacent to the interlayer 600 may be substantially the same. In detail, an energy band gap of the second electron transport region 520 and an energy band gap of the first layer 511 may be substantially the same.

Accordingly, the second electron transport region 520 may be formed of substantially the same material as the first layer 511. The second electron transport region 520 may be an electron transport layer that has substantially the same LUMO energy level and the same HOMO energy level as the first layer 511.

As described above, the second layer 512 induces electrons supplied from the second electrode layer 200 to be easily injected into the electron transport region 500-1. According to the present embodiment, since the organic light-emitting diode (OLED-1) includes the first electron transport region 510-1 composed of a plurality of layers and the hole transport region 400-1 composed of a plurality of layers, the driving voltage of the organic light-emitting diode (OLED-1) may be reduced.

Figure 6:
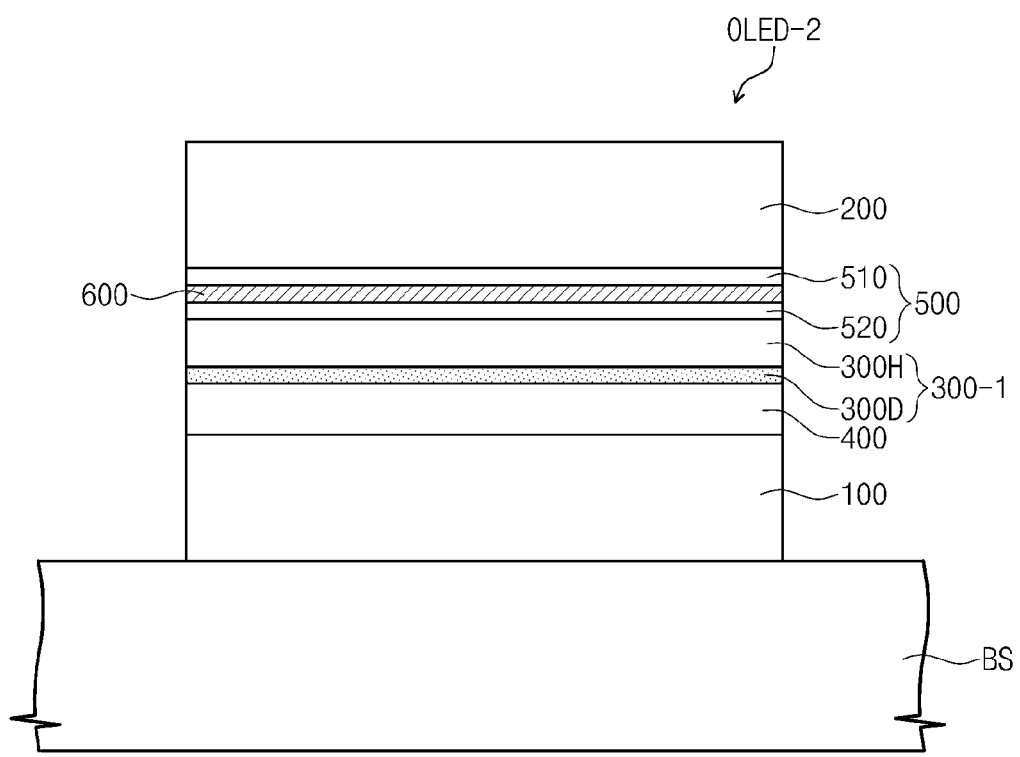
FIG. 6 is a cross-sectional view illustrating an organic light-emitting diode according to an exemplary embodiment.
Figure 7:
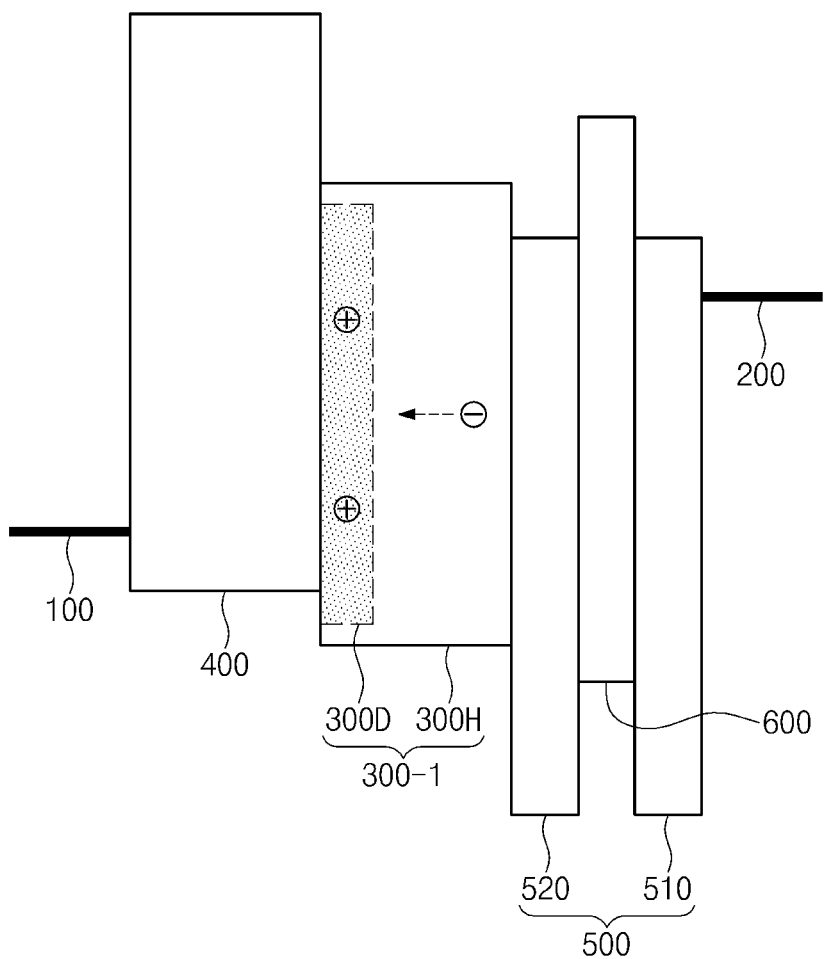
FIG. 7 is a band diagram of an organic light-emitting diode illustrated in FIG. 6.

FIG. 6 is a cross-sectional view illustrating an organic light-emitting diode according to an exemplary embodiment. FIG. 7 is a band diagram of an organic light-emitting diode illustrated in FIG. 6. An organic emitting layer (OLED-2) illustrated in FIG. 6 has the same configuration as the organic light-emitting diode (OLED) illustrated in FIG. 3 except for an emitting layer 300-1. Hereinafter, the same elements as configurations illustrated in FIGS. 1 to 4 will be represented with the same reference numerals, and a detailed description thereof will be omitted.

The emitting layer 300-1 comprises a host material and a dopant material. The host material is dispersed all over the surface of the emitting layer 300-1. The host material is relatively a base material with respect to the dopant material.

The dopant material is relatively an impurity with respect to the host material. The dopant material may be uniformly dispersed inside the emitting layer 300-1 or partially doped into only some regions. FIG. 6 illustrates an exemplary embodiment in which the dopant material is doped into only some regions.

As illustrated in FIG. 6, the light-emitting 300-1 may be partitioned into a plurality of regions according to dispersion of the dopant material. The regions include a host material region 300H and a dopant material region 300D.

The host material region 300H is a region in which the host material exists. The dopant material does not substantially exist in the host material region 300H. In the present embodiment, the dopant material includes an electron transport material. Details illustrated in FIG. 3 will be referenced by details with respect to the host material and the dopant material.

The dopant material region 300D is a region in which the host material and the dopant material are mixed. The dopant material region 300D is adjacent to a hole transport region 400, and is spaced apart from an electron transport region 500.

Generally, energy is transferred from a material having a large band gap to a material having a small band gap, so that excitons are generated in the material having the small band gap. According to the present embodiment, an energy band gap of the dopant material region 300D is lower than that of the host material region 300H. Therefore, in the organic light-emitting diode (OLED-2), holes and electrons mostly combine to each other in the dopant material region 300D to emit light.

The dopant material region 300D has relatively low LUMO energy compared to the host material region 300H. Therefore, when the dopant material region 300D is adjacent to the electron transport region 500, an injection amount of electrons from the electron transport region 500 to the emitting layer 300-1 may be increased.

Generally, as an electron transfer from the electron transport region 500 to the emitting layer 300-1 becomes active, an electron-hole balance in the emitting layer 300-1 is easily lost. Also, as the electron transfer is increased, a deterioration phenomenon of an interface between the electron transport region 500 and the emitting layer 300-1 tends to increase.

In the emitting layer 300-1 according to an exemplary embodiment, the dopant material region 300D does not contact the electron transport region 500. Therefore, even when an existing material is not changed, or a new organic is not further added, electron injection from the electron transport region 500 may be easily restricted. As a result, the luminous efficiency of the organic light-emitting diode (OLED-2) may be improved, and the lifespan of the organic light-emitting diode (OLED-2) may be improved.

An organic light-emitting diode according to an exemplary embodiment includes an interlayer disposed on an electron transport region and inserted into an electron transport layer. The interlayer does not contact each of a cathode and an emitting layer.

The interlayer restricts the number of holes that are injected from the electron transport region to the emitting layer. Also, since the interlayer does not contact the emitting layer, the interlayer may prevent electrons existing in the emitting layer from flowing out therethrough. Therefore, an electron-hole balance is maintained in the emitting layer, thereby improving the luminous efficiency of the organic light-emitting diode, and preventing the deterioration in the interlayer to improve the lifespan of the organic light-emitting diode.

Also, the organic light-emitting diode according to an embodiment of the inventive concept may further include a emitting layer that includes a dopant material region adjacent to a hole transport region. Since the dopant material region does not contact the electron transport region, the dopant material region may restrict the number of electrons injected from the electron transport region.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting diode comprising:
   a first electrode layer disposed on a base substrate;
   a second electrode layer disposed above the first electrode and opposed to the first electrode layer;
   an emitting layer disposed between the first electrode layer and the second electrode layer;
   a hole transport region disposed between the emitting layer and the first electrode layer;
   a first electron transport region disposed between the emitting layer and the second electrode;
   an interlayer disposed between the emitting layer and the first electron transport region; and
   a second electron transport region disposed between the emitting layer and the interlayer and contacting the emitting layer,
   wherein a lowest unoccupied molecular orbital (LUMO) energy level of the interlayer is higher than that of the second electron transport region.

2. The organic light-emitting diode of claim 1, wherein the second electron transport region has a substantially identical LUMO energy level as the first electron transport region.

3. The organic light-emitting diode of claim 2, wherein the second electron transport region is composed of substantially identical material as the first electron transport region.

4. The organic light-emitting diode of claim 3, wherein the second electron transport region is configured to contact the interlayer; and a portion of the first electron transport region, which is adjacent to the interlayer, has an energy band gap that is substantially identical to an energy band gap of the second electron transport region.

5. The organic light-emitting diode of claim 4, wherein the second electron transport region comprises a plurality of layers; a LUMO energy level of each of the plurality of layers is lower than that of the interlayer; and any layer of the plurality of layers that contacts the interlayer is composed of material substantially identical to material of the first electron transport region.

6. The organic light-emitting diode of claim 4, wherein the first electron transport region comprises:
   a first layer contacting the interlayer; and
   a second layer disposed between the first layer and the second electrode layer, and wherein the second electron transport region has a LUMO energy level substantially identical to the first layer LUMO energy level.

7. The organic light-emitting diode of claim 6, wherein the second electron transport region is composed of material substantially identical to the first layer.

8. The organic light-emitting diode of claim 7, wherein the first layer comprises an electron transport material, and the second layer comprises an electron injection material.

9. The organic light-emitting diode of claim 1, wherein a gap between a highest occupied molecular orbital (HOMO) energy level of the emitting layer and a HOMO energy level of the interlayer is smaller than a gap between the HOMO energy level of the emitting layer and a HOMO energy level of the second electron transport region.

10. The organic light-emitting diode of claim 9, wherein the HOMO energy level of the interlayer is higher than a HOMO energy level of the second electron transport region.

11. The organic light-emitting diode of claim 1, wherein the hole transport region comprises at least one of a hole transport layer, a hole injection layer, a single layer having a hole transport function and a hole injection function, a hole blocking layer, and a buffer layer.

12. The organic light-emitting diode of claim 11, wherein:
the emitting layer comprises a host material and a dopant material, and is divided into a first region composed of the host material and a second region composed of the host material and the dopant material; and
the second region contacts the hole transport region, and the second region is spaced apart from the electron transport region.

13. The organic light-emitting diode of claim 12, wherein an energy band gap of the second region is smaller than an energy band gap of the first region.

14. The organic light-emitting diode of claim 13, wherein a LUMO energy level of the second region is lower than a LUMO energy level of the first region.

15. The organic light-emitting diode of claim 14, wherein the dopant material is a hole transport material.

16. A display panel comprising:
a base substrate; and
an organic light-emitting diode,
wherein the organic light-emitting diode comprises:
a first electrode layer disposed on the base substrate;
a second electrode layer disposed above the first electrode, and opposed to the first electrode layer;
an emitting layer disposed between the first electrode layer and the second electrode layer;
a hole transport region disposed between the emitting layer and the first electrode layer;
a first electron transport region disposed between the emitting layer and the second electrode layer;
a second electron transport region disposed between the emitting layer and the first electron transport layer, and contacting the emitting layer; and
an interlayer disposed between the first electron transport region and the second electron transport region, and having a lowest unoccupied molecular orbital (LUMO) energy level higher than that of the second electron transport region.

17. The display panel of claim 16, further comprising:
at least one thin film transistor disposed between the base substrate and the light-emitting diode, and electrically connected to light-emitting diode; and
a capacitor disposed on the base substrate, and electrically connected to the light-emitting diode and the at least one thin film transistor.

18. The display panel of claim 17, wherein a LUMO energy level of the second electron transport region is lower than a LUMO energy level of the emitting layer; and the first electron transport region comprises a material forming the second electron transport region.

19. The display panel of claim 18, wherein the first electron transport region comprises:
a first layer contacting the interlayer; and
a second layer disposed between the first layer and the second electrode layer,
wherein material composing the second electron transport region is identical to material composing the first layer.

20. The display panel of claim 19, wherein:
the emitting layer comprises a host material and a dopant material including a hole transport material, and is partitioned into a first region composed of the host material and a second region composed of the host material and the dopant material; and
the second region contacts the hole transport region, and the second region is spaced apart from the electron transport region.

* * * * *